United States Patent
Teranishi et al.

(10) Patent No.: US 12,439,505 B2
(45) Date of Patent: Oct. 7, 2025

(54) MULTILAYER SUBSTRATE

(71) Applicant: Murata Manufacturing Co., Ltd., Nagaokakyo (JP)

(72) Inventors: Keisuke Teranishi, Nagaokakyo (JP); Hirotaka Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 217 days.

(21) Appl. No.: 18/386,353

(22) Filed: Nov. 2, 2023

(65) Prior Publication Data

US 2024/0064890 A1    Feb. 22, 2024

Related U.S. Application Data

(63) Continuation of application No. PCT/JP2022/031488, filed on Aug. 22, 2022.

(30) Foreign Application Priority Data

Sep. 7, 2021   (JP) .................................. 2021-145148

(51) Int. Cl.
*H05K 1/02* (2006.01)
(52) U.S. Cl.
CPC ................... *H05K 1/0218* (2013.01)
(58) Field of Classification Search
CPC ................................................... H05K 1/0218
(Continued)

(56) References Cited

U.S. PATENT DOCUMENTS

2001/0040490 A1   11/2001   Tanaka
2015/0091675 A1    4/2015   Kato
(Continued)

FOREIGN PATENT DOCUMENTS

EP   2 244 331 A1   10/2010
JP      044405 U     1/1992
(Continued)

OTHER PUBLICATIONS

International Search Report in PCT/JP2022/031488, mailed Nov. 1, 2022, 3 pages.
(Continued)

*Primary Examiner* — Andargie M Aychillhum
(74) *Attorney, Agent, or Firm* — Keating & Bennett, LLP

(57) ABSTRACT

In a multilayer substrate, first interlayer connection conductors pass through resin layers in a lamination direction and electrically connect first and second signal conductors. Second interlayer connection conductors pass through the resin layers in the lamination direction and electrically connect the first and second signal conductors. The first interlayer connection conductors are aligned in a first row extending along the first signal conductor when viewed in the lamination direction. The second interlayer connection conductors are aligned in a second row extending along the first signal conductor when viewed in the lamination direction. A direction perpendicular to the direction in which the first signal conductor extends, when viewed in the lamination direction, is a line width direction. A position of the second row in the line width direction is different from a position of the first row in the line width direction.

21 Claims, 7 Drawing Sheets

(58) Field of Classification Search
USPC .......................................................... 174/251
See application file for complete search history.

(56) References Cited

U.S. PATENT DOCUMENTS

2021/0057820 A1* 2/2021 Sudo .................... H01Q 1/2283
2022/0328983 A1* 10/2022 Takayama ............ H01Q 1/2283

FOREIGN PATENT DOCUMENTS

| JP | 2000059113 A | 2/2000 |
| JP | 2013126029 A | 6/2013 |
| WO | 2014057761 A1 | 4/2014 |

OTHER PUBLICATIONS

Written Opinion in PCT/JP2022/031488, mailed Nov. 1, 2022, 4 pages.

\* cited by examiner

MULTILAYER SUBSTRATE

CROSS REFERENCE TO RELATED APPLICATIONS

This application claims the benefit of priority to Japanese Patent Application No. 2021-145148 filed on Sep. 7, 2021 and is a Continuation Applications of PCT Application No. PCT/JP2022/031488 filed on Aug. 22, 2022. The entire contents of each application are hereby incorporated herein by reference.

BACKGROUND OF THE INVENTION

1. Field of the Invention

The present invention relates to a multilayer substrate including signal conductors.

2. Description of the Related Art

Conventional inventions related to multilayer substrates include, for example, a high-frequency signal line described in International Publication No. 2014/057761. The high-frequency signal line includes two signal lines. Both ends of the two signal lines are each connected by a via-hole conductor. Thus, the two signal lines are connected in parallel. Therefore, a high-frequency signal is transmitted through two signal lines. Thus, the resistance of the high-frequency signal line is reduced.

SUMMARY OF THE INVENTION

However, there is a desire to further reduce the resistance of the high-frequency signal line described in International Publication No. 2014/057761.

Therefore, preferred embodiments of the present invention reduce the resistance of a multilayer substrate.

A multilayer substrate according to an aspect of a preferred embodiment of the present invention includes a laminate including a plurality of resin layers laminated in a lamination direction, a first signal conductor provided in the laminate, a second signal conductor provided in the laminate, a position of the second signal conductor in the lamination direction being different from a position of the first signal conductor in the lamination direction, at least a portion of the second signal conductor overlapping the first signal conductor when viewed in the lamination direction, a plurality of first interlayer connection conductors passing through the resin layers in the lamination direction and electrically connecting the first signal conductor and the second signal conductor, and a plurality of second interlayer connection conductors passing through the resin layers in the lamination direction and electrically connecting the first signal conductor and the second signal conductor, wherein the plurality of first interlayer connection conductors are aligned in a first row extending along the first signal conductor when viewed in the lamination direction, the plurality of second interlayer connection conductors are aligned in a second row extending along the first signal conductor when viewed in the lamination direction, a direction perpendicular to the direction in which the first signal conductor extends, when viewed in the lamination direction, is a line width direction, a position of the second row in the line width direction is different from a position of the first row in the line width direction.

The plurality of first interlayer connection conductors are aligned in a first row extending along the first signal conductor when viewed in the lamination direction.

The plurality of second interlayer connection conductors are aligned in a second row extending along the first signal conductor when viewed in the lamination direction.

A direction perpendicular to the direction in which the first signal conductor extends, when viewed in the lamination direction, is a line width direction.

A position of the second row in the line width direction is different from a position of the first row in the line width direction.

With the multilayer substrates according to preferred embodiments of the present invention, the resistance of the multilayer substrates can be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a cross-sectional view of a multilayer substrate 10a.

DETAILED DESCRIPTION OF THE PREFERRED EMBODIMENTS

Preferred Embodiments
Structure of Multilayer Substrate 10

Figure 1:
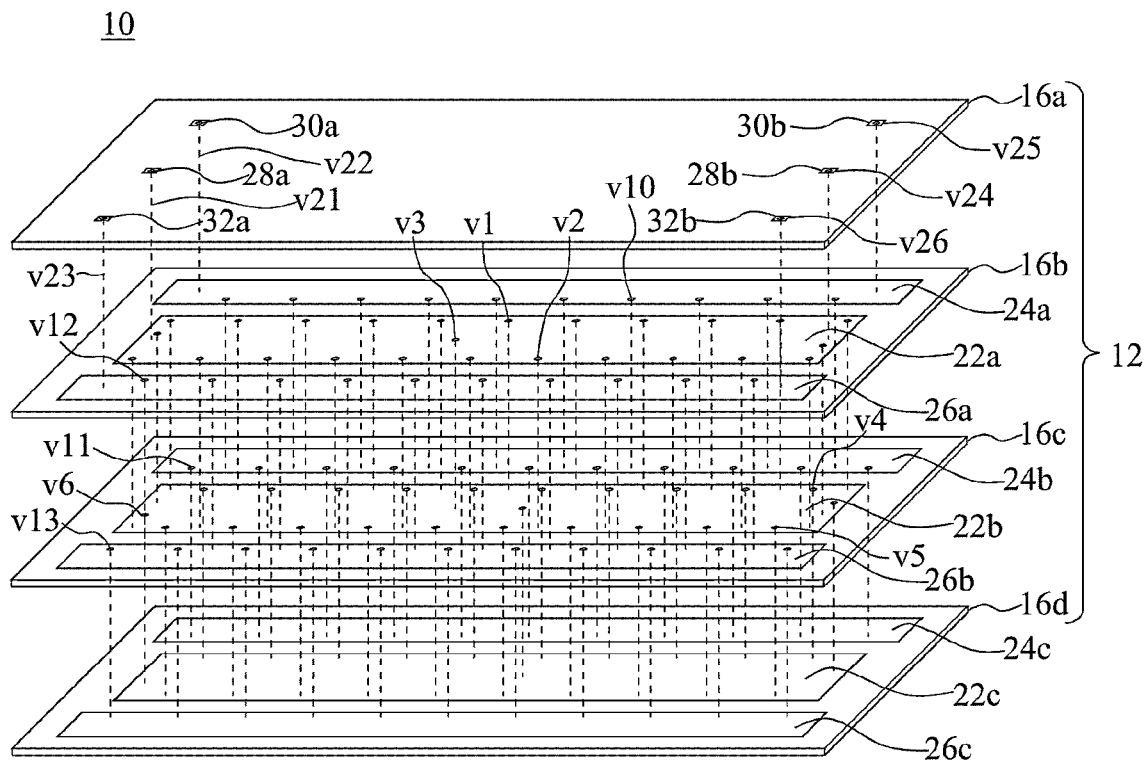
FIG. 1 is an exploded perspective view of a multilayer substrate 10.
Figure 1:
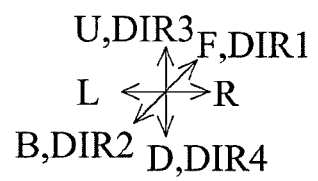
Figure 2:
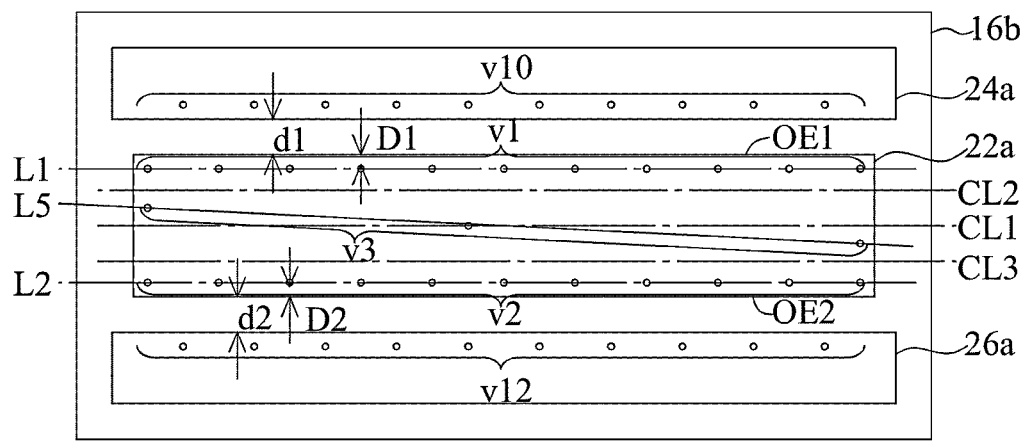
FIG. 2 is a top view of a resin layer 16b of the multilayer substrate 10.
Figure 2:
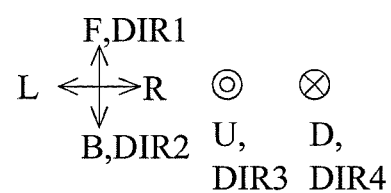
Figure 3:
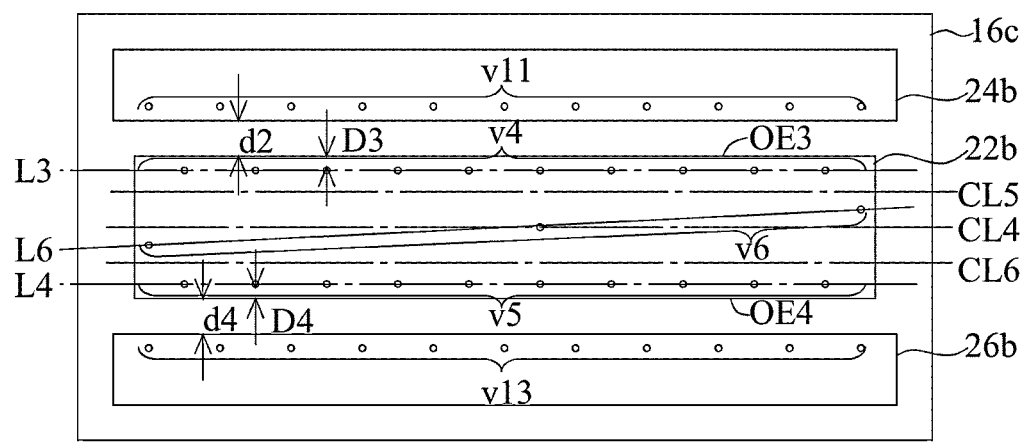
FIG. 3 is a top view of a resin layer 16c of the multilayer substrate 10.
Figure 3:
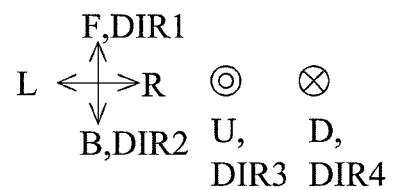

The structure of a multilayer substrate 10 according to a preferred embodiment of the present invention will be described below with reference to the drawings. FIG. 1 is an exploded perspective view of the multilayer substrate 10. FIG. 2 is a top view of a resin layer 16b of the multilayer substrate 10. FIG. 3 is a top view of a resin layer 16c of the multilayer substrate 10.

In the present description, various directions are defined as follows. The lamination direction of a laminate 12 of the multilayer substrate 10 is an up-down direction. One side of the up-down direction (lamination direction) is a third direction DIR3. The other side of the up-down direction (lamination direction) is a fourth direction DIR4. In the present preferred embodiment, the up direction is the third direction DIR3, and the down direction is the fourth direction DIR4. The direction in which a first signal conductor 22a, a second signal conductor 22b, and a third signal conductor 22c of the multilayer substrate 10 extend is a left-right direction. A direction perpendicular to the direction in which the first signal conductor 22a extends, when viewed in the up-down direction (lamination direction), is a line width direction. A front-back direction is the line width direction of the first signal conductor 22a. One side of the front-back direction (line width direction) is a first direction DIR1. The other side of the front-back direction (line width direction) is a second direction DIR2. In the present preferred embodiment, the front direction is the first direction DIR1, and the back direction is the second direction DIR2. The up-down direction, the front-back direction, and the left-right direction are perpendicular to each other. Note that the up-down direction, the front-back direction, and the left-right direction in the present description do not have to match the up-down direction, the front-back direction, and the left-right direction of the multilayer substrate 10 in actual use.

The definitions of terms used in the present description are explained below. First, the positional relationship of the members in the present description will be defined. X through Z are the members or components that define the multilayer substrate 10. In the present description, "X and Y are electrically connected" means that electricity can be conducted between X and Y. Thus, X and Y may but do not have to be in contact with each other. When X and Y are not in contact with each other, a conductive Z is placed between X and Y. On the other hand, in the present description, "X and Y are connected" means that X and Y are connected in a state where X and Y are in contact with each other.

Hereinafter, X is a component or member of the multilayer substrate 10. In the present description, unless otherwise noted, each portion of X is defined as follows. A front portion of X means the front half of X. A back portion of X means the back half of X. A left portion of X means the left half of X. A right portion of X means the right half of X. An upper portion of X means the upper half of X. A lower portion of X means the lower half of X. A front end of X means an end of X in the front direction. A back end of X means an end of X in the back direction. A left end of X means an end of X in the left direction. A right end of X means an end of X in the right direction. An upper end of X means an end of X in the up direction. A lower end of X means an end of X in the down direction. A front-end portion of X means the front end of X and its vicinity. A back-end portion of X means the back end of X and its vicinity. A left-end portion of X means the left end of X and its vicinity. A right-end portion of X means the right end of X and its vicinity. An upper-end portion of X means the upper end of X and its vicinity. A lower-end portion of X means the lower end of X and its vicinity.

First, the structure of the multilayer substrate 10 will be described with reference to FIG. 1. The multilayer substrate 10 transmits a high-frequency signal. The multilayer substrate 10 is used to electrically connect two circuits in an electronic device such as a smartphone. The multilayer substrate 10 has a band shape extending in the left-right direction, as shown in FIG. 1.

As shown in FIG. 1, the multilayer substrate 10 includes a laminate 12, a first signal conductor 22a, a second signal conductor 22b, a third signal conductor 22c, ground conductors 24a, 24b, 24c, 26a, 26b and 26c, signal electrodes 28a and 28b, ground electrodes 30a, 30b, 32a and 32b, a plurality of first interlayer connection conductors v1, a plurality of second interlayer connection conductors v2, a plurality of third interlayer connection conductors v3, a plurality of fourth interlayer connection conductors v4, a plurality of fifth interlayer connection conductors v5, a plurality of sixth interlayer connection conductors v6, a plurality of interlayer connection conductors v10, a plurality of interlayer connection conductors v11, a plurality of interlayer connection conductors v12, a plurality of interlayer connection conductors v13, and interlayer connection conductors v21 to v26.

The laminate 12 has a plate shape, as shown in FIG. 1. Thus, the laminate 12 includes an upper main surface and a lower main surface arranged in the up-down direction. The laminate 12 has a structure in which resin layers 16a to 16d are laminated in the up-down direction (lamination direction), as shown in FIG. 1. The resin layers 16a to 16d are arranged in this order from up to down. The resin layers 16a to 16d have the same band shape as that of the laminate 12 when viewed in the up-down direction. The resin layers 16a to 16d are flexible dielectric sheets. The material of the resin layers 16a to 16d includes a thermoplastic resin. Examples of the thermoplastic resin include liquid crystal polymer and PTFE (polytetrafluoroethylene). The material of the resin layers 16a to 16d may also be polyimide. Thus, the laminate 12 is flexible. Therefore, the multilayer substrate 10 can be used in a bent state. Bending the multilayer substrate 10 means deforming the multilayer substrate 10 by applying an external force to the multilayer substrate 10. Deformation may be elastic deformation, plastic deformation, or elastic and plastic deformation.

The first signal conductor 22a is provided in the laminate 12, as shown in FIG. 1. More specifically, the first signal conductor 22a is located on an upper main surface of the resin layer 16b. The first signal conductor 22a has a linear shape extending in the left-right direction.

Here, as shown in FIG. 2, a line passing through the center of the first signal conductor 22a in the front-back direction (line width direction) when viewed in the up-down direction (lamination direction) is a first center line CL1. The first center line CL1 extends in the left-right direction. When viewed in the up-down direction, the outer edge of the first signal conductor 22a includes a first outer edge OE1. The first outer edge OE1 is located in front of the first center line CL1 (i.e., located farther in the first direction DIR1 than the first center line CL1) when viewed in the up-down direction (lamination direction). The first outer edge OE1 extends in a direction (left-right direction) perpendicular to the front-back direction (line width direction). A line passing through the midpoint between the first center line CL1 and the first outer edge OE1 when viewed in the up-down direction (lamination direction) is a second center line CL2. The second center line CL2 extends in the left-right direction.

When viewed in the up-down direction, the outer edge of the first signal conductor 22a includes a second outer edge OE2. The second outer edge OE2 is located behind the first center line CL1 (i.e., located farther in the second direction DIR2 than the first center line CL1) when viewed in the up-down direction (lamination direction). The second outer edge OE2 extends in a direction (left-right direction) perpendicular to the front-back direction (line width direction). A line passing through the midpoint between the first center line CL1 and the second outer edge OE2 when viewed in the up-down direction (lamination direction) is a third center line CL3. The third center line CL3 extends in the left-right direction.

The second signal conductor 22b is provided in the laminate 12. The position of the second signal conductor 22b in the up-down direction (lamination direction) is different from the position of the first signal conductor 22a in the up-down direction (lamination direction). The second signal conductor 22b is located below the first signal conductor 22a (i.e., located farther in the fourth direction DIR4 than the first signal conductor 22a). Therefore, the second signal conductor 22b is located on an upper main surface of the resin layer 16c. The second signal conductor 22b has a linear shape extending in the left-right direction. At least a portion of the second signal conductor 22b overlaps the first signal conductor 22a when viewed in the up-down direction (lamination direction), as shown in FIGS. 1 and 3. In the present preferred embodiment, the shape of the second signal conductor 22b viewed in the up-down direction is the same as the shape of the first signal conductor 22a when viewed in the up-down direction. The entire outer edge of the second signal conductor 22b overlaps the entire outer edge of the first signal conductor 22a when viewed in the up-down direction. Thus, when viewed in the up-down direction, the entire second signal conductor 22b overlaps the first signal conductor 22a.

Here, as shown in FIG. 3, a line passing through the center of the second signal conductor 22b in the front-back direction (line width direction) when viewed in the up-down direction (lamination direction) is a fourth center line CL4. The fourth center line CL4 extends in the left-right direction. When viewed in the up-down direction, the outer edge of the second signal conductor 22b includes a third outer edge OE3. The third outer edge OE3 is located in front of the fourth center line CL4 (i.e., located farther in the first direction DIR1 than the fourth center line CL4) when viewed in the up-down direction (lamination direction). The third outer edge OE3 extends in a direction (left-right direction) perpendicular to the front-back direction (line width direction). A line passing through the midpoint between the fourth center line CL4 and the third outer edge OE3 when viewed in the up-down direction (lamination direction) is a fifth center line CL5. The fifth center line CL5 extends in the left-right direction.

When viewed in the up-down direction, the outer edge of the second signal conductor 22b includes a fourth outer edge OE4. The fourth outer edge OE4 is located behind the fourth center line CL4 (i.e., located farther in the second direction DIR2 than the fourth center line CL4) when viewed in the up-down direction (lamination direction). The fourth outer edge OE4 extends in a direction (left-right direction) perpendicular to the front-back direction (line width direction). A line passing through the midpoint between the fourth center line CL4 and the fourth outer edge OE4 when viewed in the up-down direction (lamination direction) is a sixth center line CL6. The sixth center line CL6 extends in the left-right direction.

The third signal conductor 22c is provided in the laminate 12. The position of the third signal conductor 22c in the up-down direction (lamination direction) is different from the position of the first signal conductor 22a in the up-down direction (lamination direction) and the position of the second signal conductor 22b in the up-down direction (lamination direction). The third signal conductor 22c is located below the second signal conductor 22b (i.e., located farther in the fourth direction DIR4 than the second signal conductor 22b). Therefore, the third signal conductor 22c is located on an upper main surface of the resin layer 16d. The third signal conductor 22c has a linear shape extending in the left-right direction. At least a portion of the third signal conductor 22c overlaps the first signal conductor 22a and the second signal conductor 22b when viewed in the up-down direction (lamination direction), as shown in FIG. 1. In the present preferred embodiment, the shape of the third signal conductor 22c viewed in the up-down direction is the same as the shape of the first signal conductor 22a viewed in the up-down direction and the second signal conductor 22b viewed in the up-down direction. The entire outer edge of the third signal conductor 22c overlaps the entire outer edge of the first signal conductor 22a and the entire outer edge of the second signal conductor 22b when viewed in the up-down direction. Thus, when viewed in the up-down direction, the entire third signal conductor 22c overlaps the first signal conductor 22a and the second signal conductor 22b.

A high-frequency signal is transmitted in the above-described first signal conductor 22a, the second signal conductor 22b, and the third signal conductor 22c. The frequency of the high-frequency signal is, for example, about 13.56 MHz.

The plurality of first interlayer connection conductors v1 pass through the resin layer 16b in the up-down direction (lamination direction), as shown in FIGS. 1 and 2. The plurality of first interlayer connection conductors v1 electrically connect the first signal conductor 22a and the second signal conductor 22b. The plurality of first interlayer connection conductors v1 are aligned in a first row L1 extending along the first signal conductor 22a, when viewed in the up-down direction (lamination direction). In the present preferred embodiment, the first row L1 is a straight line extending in the left-right direction. The number of the plurality of first interlayer connection conductors v1 is three or more. At least some of the plurality of first interlayer connection conductors v1 are aligned at equal intervals. In the present preferred embodiment, all first interlayer connection conductors v1 are aligned at equal intervals.

The first row L1 is located in front of the first center line CL1 (i.e., located farther in the first direction DIR1 than the first center line CL1). Furthermore, at least a portion of each of the plurality of first interlayer connection conductors v1 is located between the first outer edge OE1 and the second center line CL2, when viewed in the up-down direction. In the present preferred embodiment, the entirety of each of the plurality of first interlayer connection conductors v1 is located between the first outer edge OE1 and the second center line CL2, when viewed in the up-down direction. The shortest distance D1 from each of the plurality of first interlayer connection conductors v1 to the first outer edge OE1 is larger than the maximum diameter of the plurality of first interlayer connection conductors v1.

The plurality of second interlayer connection conductors v2 pass through the resin layer 16b in the up-down direction (lamination direction), as shown in FIGS. 1 and 2. The plurality of second interlayer connection conductors v2 electrically connect the first signal conductor 22a and the second signal conductor 22b. The plurality of second interlayer connection conductors v2 are aligned in a second row L2 extending along the first signal conductor 22a, when viewed in the up-down direction (lamination direction). In the present preferred embodiment, the second row L2 is a straight line extending in the left-right direction. The number of the plurality of second interlayer connection conductors v2 is three or more. At least some of the plurality of second interlayer connection conductors v2 are aligned at equal intervals. In the present preferred embodiment, all second interlayer connection conductors v2 are aligned at equal intervals.

The position of the second row L2 in the front-back direction (line width direction) is different from the position of the first row L1 in the front-back direction (line width direction). In the present preferred embodiment, the second row L2 is located behind the first center line CL1 (i.e., located farther in the second direction DIR2 than the first center line CL1). Furthermore, at least a portion of each of the plurality of second interlayer connection conductors v2 is located between the second outer edge OE2 and the third center line CL3, when viewed in the up-down direction. In the present preferred embodiment, the entirety of each of the plurality of second interlayer connection conductors v2 is located between the second outer edge OE2 and the third center line CL3, when viewed in the up-down direction. The shortest distance D2 from each of the plurality of second interlayer connection conductors v2 to the third outer edge OE3 is larger than the maximum diameter of the plurality of second interlayer connection conductors v2. Each of the plurality of second interlayer connection conductors v2 described above overlaps a respective one of the plurality of first interlayer connection conductors v1 when viewed in the front-back direction. Thus, a plurality of pairs, each including one first interlayer connection conductor v1 and one second interlayer connection conductor v2 aligned in the front-back direction, are aligned in the left-right direction.

The plurality of third interlayer connection conductors v3 pass through the resin layer 16b in the up-down direction (lamination direction). The plurality of third interlayer connection conductors v3 electrically connect the first signal conductor 22a and the second signal conductor 22b. The plurality of third interlayer connection conductors v3 are located between the first row L1 and the second row L2, when viewed in the up-down direction. More specifically, the plurality of third interlayer connection conductors v3 are aligned in a fifth row L5 extending along the first signal conductor 22a, when viewed in the up-down direction (lamination direction). In the present preferred embodiment, the fifth row L5 is a straight line extending in the left-right direction. The number of the plurality of third interlayer connection conductors v3 is three or more. However, the number of the third interlayer connection conductors v3 is less than the number of the first interlayer connection conductors v1 and the number of the second interlayer connection conductors v2. The third interlayer connection conductors v3 may be aligned at equal intervals.

The plurality of fourth interlayer connection conductors v4 pass through the resin layer 16c in the up-down direction (lamination direction), as shown in FIGS. 1 and 3. The plurality of fourth interlayer connection conductors v4 electrically connect the second signal conductor 22b and the third signal conductor 22c. The plurality of fourth interlayer connection conductors v4 are aligned in a third row L3 extending along the second signal conductor 22b, when viewed in the up-down direction (lamination direction). In the present preferred embodiment, the third row L3 is a straight line extending in the left-right direction. The number of the plurality of fourth interlayer connection conductors v4 is three or more. At least some of the plurality of fourth interlayer connection conductors v4 are aligned at equal intervals. In the present preferred embodiment, all fourth interlayer connection conductors v4 are aligned at equal intervals.

The third row L3 overlaps the first row L1 when viewed in the up-down direction (lamination direction). Furthermore, the third row L3 is located in front of the fourth center line CL4 (i.e., located farther in the first direction DIR1 than the fourth center line CL4). Thus, at least a portion of each of the plurality of fourth interlayer connection conductors v4 is located between the third outer edge OE3 and the fifth center line CL5, when viewed in the up-down direction. In the present preferred embodiment, the entirety of each of the plurality of fourth interlayer connection conductors v4 is located between the third outer edge OE3 and the fifth center line CL5, when viewed in the up-down direction. The shortest distance D3 from each of the plurality of fourth interlayer connection conductors v4 to the third outer edge OE3 is larger than the maximum diameter of the plurality of fourth interlayer connection conductors v4. Each of the plurality of fourth interlayer connection conductors v4 described above does not overlap a respective one of the plurality of first interlayer connection conductors v1 when viewed in the up-down direction (lamination direction). When viewed in the up-down direction, the plurality of first interlayer connection conductors v1 and the plurality of fourth interlayer connection conductors v4 are alternately aligned in the left-right direction.

The plurality of fifth interlayer connection conductors v5 pass through the resin layer 16c in the up-down direction (lamination direction), as shown in FIGS. 1 and 3. The plurality of fifth interlayer connection conductors v5 electrically connect the second signal conductor 22b and the third signal conductor 22c. The plurality of fifth interlayer connection conductors v5 are aligned in a fourth row L4 extending along the second signal conductor 22b, when viewed in the up-down direction (lamination direction). In the present preferred embodiment, the fourth row L4 is a straight line extending in the left-right direction. The number of the plurality of fifth interlayer connection conductors v5 is three or more. At least some of the plurality of fifth interlayer connection conductors v5 are aligned at equal intervals. In the present preferred embodiment, all fifth interlayer connection conductors v5 are aligned at equal intervals.

The fourth row L4 overlaps the second row L2 when viewed in the up-down direction (lamination direction). Therefore, the position of the fourth row L4 in the front-back direction (line width direction) is different from the position of the third row L3 in the front-back direction (line width direction). In the present preferred embodiment, the fourth row L4 is located behind the fourth center line CL4 (i.e., located farther in the second direction DIR2 than the fourth center line CL4). Thus, at least a portion of each of the plurality of fifth interlayer connection conductors v5 is located between the fourth outer edge OE4 and the sixth center line CL6, when viewed in the up-down direction. In the present preferred embodiment, the entirety of each of the plurality of fifth interlayer connection conductors v5 is located between the fourth outer edge OE4 and the sixth center line CL6, when viewed in the up-down direction. The shortest distance D4 from each of the plurality of fifth interlayer connection conductors v5 to the fourth outer edge OE4 is larger than the maximum diameter of the plurality of fifth interlayer connection conductors v5. Each of the plurality of fifth interlayer connection conductors v5 described above overlaps a respective one of the plurality of fourth interlayer connection conductors v4 when viewed in the front-back direction. Thus, a plurality of pairs, each including one fourth interlayer connection conductor v4 and one fifth interlayer connection conductor v5 aligned in the front-back direction, are aligned in the left-right direction. Each of the plurality of fifth interlayer connection conductors v5 described above does not overlap a respective one of the plurality of second interlayer connection conductors v2 when viewed in the up-down direction (lamination direction). When viewed in the up-down direction, the plurality of second interlayer connection conductors v2 and the plurality of fifth interlayer connection conductors v5 are alternately aligned in the left-right direction.

The plurality of sixth interlayer connection conductors v6 pass through the resin layer 16c in the up-down direction (lamination direction). The plurality of sixth interlayer connection conductors v6 electrically connect the second signal conductor 22b and the third signal conductor 22c. The plurality of sixth interlayer connection conductors v6 are located between the third row L3 and the fourth row L4, when viewed in the up-down direction. More specifically, the plurality of sixth interlayer connection conductors v6 are aligned in a sixth row L6 extending along the second signal conductor 22b, when viewed in the up-down direction (lamination direction). In the present preferred embodiment, the sixth row L6 is a straight line extending in the left-right direction. The number of the plurality of sixth interlayer connection conductors v6 is three or more. However, the number of the sixth interlayer connection conductors v6 is less than the number of the fourth interlayer connection conductors v4 and the number of the fifth interlayer connection conductors v5. The sixth interlayer connection conductors v6 may be aligned at equal intervals.

The ground conductor 24a (first ground conductor/first different-potential conductor) is provided in the laminate 12, as shown in FIGS. 1 and 2. The ground conductor 24a is located on the upper main surface of the resin layer 16b. Therefore, the position of the ground conductor 24a in the up-down direction is the same as the position of the first signal conductor 22a in the up-down direction. However, the ground conductor 24a (first ground conductor/first different-potential conductor) is located in front of the first signal conductor 22a (i.e., located farther in the first direction DIR1 than the first signal conductor 22a). The ground conductor 24a has a band shape extending in the left-right direction. Thus, the ground conductor 24a extends in parallel with the first signal conductor 22a in front of the first signal conductor 22a. The shortest distance d1 between the ground conductor 24a and the first signal conductor 22a is larger than the maximum diameter of the plurality of first interlayer connection conductors v1, when viewed in the up-down direction (lamination direction).

The ground conductor 24b (second ground conductor) is provided in the laminate 12, as shown in FIGS. 1 and 3. The position of the ground conductor 24b (second ground conductor) in the up-down direction (lamination direction) is different from position of the ground conductor 24a (first ground conductor) in the up-down direction (lamination direction). The ground conductor 24b is located below the ground conductor 24a. Therefore, the ground conductor 24b is located on the upper main surface of the resin layer 16c. Thus, the position of the ground conductor 24b in the up-down direction is the same as the position of the second signal conductor 22b in the up-down direction. However, the ground conductor 24b is located in front of the second signal conductor 22b (i.e., located farther in the first direction DIR1 than the second signal conductor 22b). The ground conductor 24b has a band shape extending in the left-right direction. Thus, the ground conductor 24b extends in parallel with the second signal conductor 22b in front of the second signal conductor 22b. The shortest distance d2 between the ground conductor 24b and the second signal conductor 22b is larger than the maximum diameter of the plurality of second interlayer connection conductors v2 to be described below, when viewed in the up-down direction (lamination direction). The ground conductor 24b (second ground conductor) overlaps the ground conductor 24a (first ground conductor) when viewed in the up-down direction (lamination direction).

The ground conductor 24c is provided in the laminate 12, as shown in FIG. 1. The position of the ground conductor 24c in the up-down direction (lamination direction) is different from the positions of the ground conductor 24a and the ground conductor 24b in the up-down direction (lamination direction). The ground conductor 24c is located below the ground conductor 24b. Therefore, the ground conductor 24c is located on the upper main surface of the resin layer 16d. Therefore, the position of the ground conductor 24c in the up-down direction is the same as the position of the third signal conductor 22c in the up-down direction. However, the ground conductor 24c is located in front of the third signal conductor 22c (i.e., located farther in the first direction DIR1 than the third signal conductor 22c). The ground conductor 24c has a band shape extending in the left-right direction. Thus, the ground conductor 24c extends in parallel with the third signal conductor 22c in front of the third signal conductor 22c. The ground conductor 24c overlaps the ground conductor 24a when viewed in the up-down direction (lamination direction).

The plurality of interlayer connection conductors v10 (ground interlayer connection conductors) pass through the resin layer 16b in the up-down direction (lamination direction), as shown in FIGS. 1 and 2. The plurality of interlayer connection conductors v10 (ground interlayer connection conductors) electrically connect the ground conductor 24a (first ground conductor) and the ground conductor 24b (second ground conductor). The plurality of interlayer connection conductors v10 (ground interlayer connection conductors) are aligned along the first signal conductor 22a. The plurality of interlayer connection conductors v10 are aligned at equal intervals. However, each of the plurality of interlayer connection conductors v10 (ground interlayer connection conductors) does not overlap a respective one of the plurality of first interlayer connection conductors v1, when viewed in the front-back direction (line width direction). When viewed in the front-back direction, the plurality of first interlayer connection conductors v1 and the plurality of interlayer connection conductors v10 are alternately aligned in the left-right direction.

The plurality of interlayer connection conductors v11 pass through the resin layer 16c in the up-down direction (lamination direction), as shown in FIGS. 1 and 3. The plurality of interlayer connection conductors v11 electrically connect the ground conductor 24b (second ground conductor) and the ground conductor 24c (third ground conductor). The plurality of interlayer connection conductors v11 are aligned along the second signal conductor 22b. The plurality of interlayer connection conductors v11 are aligned at equal intervals. However, each of the plurality of interlayer connection conductors v11 does not overlap a respective one of the plurality of fourth interlayer connection conductors v4 when viewed in the front-back direction (line width direction). When viewed in the front-back direction, the plurality of fourth interlayer connection conductors v4 and the plurality of interlayer connection conductors v11 are alternately aligned in the left-right direction. Furthermore, each of the plurality of interlayer connection conductors v11 does not overlap a respective one of the plurality of interlayer connection conductors v10 when viewed in the up-down direction. When viewed in the up-down direction, the plurality of interlayer connection conductors v10 and the plurality of interlayer connection conductors v11 are alternately aligned in the left-right direction.

Since the ground conductors 26a to 26c and the interlayer connection conductors v12 and v13 have a structure that is front-back symmetrical with the structure of the ground conductors 24a to 24c and the interlayer connection conductors v10 and v11, their description is omitted.

The signal electrodes 28a and 28b and the ground electrodes 30a, 30b, 32a and 32b are provided in the laminate 12. The signal electrodes 28a and 28b and the ground electrodes 30a, 30b, 32a and 32b are located on the upper main surface of the resin layer 16a. The signal electrode 28a and the ground electrodes 30a and 32a are located in the left-end portion of the resin layer 16a. The ground electrode 30a, the signal electrode 28a, and the ground electrode 32a are arranged in this order from front to back. The signal electrode 28b and the ground electrodes 30b and 32b are located in the right-end portion of the resin layer 16a. The ground electrode 30b, the signal electrode 28b, and the ground electrode 32b are arranged in this order from front to back. The signal electrodes 28a and 28b and the ground electrodes 30a, 30b, 32a and 32b described above define a rectangular shape when viewed in the up-down direction.

The interlayer connection conductors v21 to v26 pass through the resin layer 16a in the up-down direction. The interlayer connection conductor v21 electrically connects the left-end portion of the first signal conductor 22a and the signal electrode 28a. The interlayer connection conductor v22 electrically connects the left-end portion of the ground conductor 24a and the ground electrode 30a. The interlayer connection conductor v23 electrically connects the left-end portion of the ground conductor 26a and the ground electrode 32a. The interlayer connection conductor v24 electrically connects the right-end portion of the first signal conductor 22a and the signal electrode 28b. The interlayer connection conductor v25 electrically connects the right-end portion of the ground conductor 24a and the ground electrode 30b. The interlayer connection conductor v26 electrically connects the right-end portion of the ground conductor 26a and the ground electrode 32b.

In the multilayer substrate 10 described above, a high-frequency signal is input and output via the signal electrodes 28a and 28b. The ground electrodes 30a, 30b, 32a and 32b are connected to the ground potential.

The first signal conductor 22a, the second signal conductor 22b, the third signal conductor 22c, the ground conductors 24a, 24b, 24c, 26a, 26b and 26c, the signal electrodes 28a and 28b, and the ground electrodes 30a, 30b, 32a and 32b are conductor layers formed by patterning metallic foil attached to the upper main surfaces of the resin layers 16a to 16d. The metallic foil is, for example, copper foil.

The plurality of first interlayer connection conductors v1, the plurality of second interlayer connection conductors v2, the plurality of third interlayer connection conductors v3, the plurality of fourth interlayer connection conductors v4, the plurality of fifth interlayer connection conductors v5, the plurality of sixth interlayer connection conductors v6, the plurality of interlayer connection conductors v10, the plurality of interlayer connection conductors v11, the plurality of interlayer connection conductors v12, the plurality of interlayer connection conductors v13 and the interlayer connection conductors v21 to v26 are via-hole conductors formed by filling through holes passing through the resin layers 16a to 16d in the up-down direction with a conductive paste and solidifying the conductive paste by heating. However, the plurality of first interlayer connection conductors v1, the plurality of second interlayer connection conductors v2, the plurality of third interlayer connection conductors v3, the plurality of fourth interlayer connection conductors v4, the plurality of fifth interlayer connection conductors v5, the plurality of sixth interlayer connection conductors v6, the plurality of interlayer connection conductors v10, the plurality of interlayer connection conductors v11, the plurality of interlayer connection conductors v12, the plurality of The interlayer connection conductors v13 and the interlayer connection conductors v21 to v26 may also be through-hole conductors formed by plating on the inner surface of the through holes passing through the resin layers 16a to 16d in the up-down direction.

Effects

With the multilayer substrate 10, the resistance of the multilayer substrate 10 can be reduced. More specifically, the plurality of first interlayer connection conductors v1 electrically connect the first signal conductor 22a and the second signal conductor 22b. The plurality of second interlayer connection conductors v2 electrically connect the first signal conductor 22a and the second signal conductor 22b. The plurality of first interlayer connection conductors v1 are aligned in the first row L1 extending along the first signal conductor 22a, when viewed in the up-down direction. The plurality of second interlayer connection conductors v2 are aligned in the second row L2 extending along the first signal conductor 22a, when viewed in the up-down direction. The position of the second row L2 in the front-back direction is different from the position of the first row L1 in the front-back direction. Thus, the first signal conductor 22a and the second signal conductor 22b are connected by many interlayer connection conductors. Furthermore, the plurality of first interlayer connection conductors v1 and the plurality of second interlayer connection conductors v2 become easy to be uniformly distributed over the entire first signal conductor 22a and the entire second signal conductor 22b. As a result, with the multilayer substrate 10, the resistance of the multilayer substrate 10 can be reduced.

With the multilayer substrate 10, the resistance of the multilayer substrate 10 can be further reduced. More specifically, at least some of the plurality of first interlayer connection conductors v1 are aligned at equal intervals. Thus, the effect of the plurality of first interlayer connection conductors v1 in reducing the resistance of the multilayer substrate 10 becomes easier to occur uniformly in the first signal conductor 22a and the second signal conductor 22b. As a result, with the multilayer substrate 10, the resistance of the multilayer substrate 10 can be further reduced.

With the multilayer substrate 10, the resistance of the multilayer substrate 10 can be further reduced. More specifically, the first row L1 is located in front of the first center line CL1. The second row L2 is located behind the first center line CL1. Thus, the distance between the first row L1 and the second row L2 is increased. Thus, the cross-sectional area of the current path in the first signal conductor 22a and the second signal conductor 22b becomes wider. As a result, with the multilayer substrate 10, the resistance of the multilayer substrate 10 can be further reduced.

With the multilayer substrate 10, the resistance of the multilayer substrate 10 can be further reduced. More specifically, at least a portion of each of the plurality of first interlayer connection conductors v1 is located between the first outer edge OE1 and the second center line CL2, when viewed in the up-down direction. Thus, the distance between the first row L1 and the second row L2 is further increased. Thus, the cross-sectional area of the current path in the first signal conductor 22a and the second signal conductor 22b becomes wider. As a result, with the multilayer substrate 10, the resistance of the multilayer substrate 10 can be further reduced.

With the multilayer substrate 10, the resistance of the multilayer substrate 10 can be further reduced. More specifically, at least a portion of each of the plurality of first interlayer connection conductors v1 is located between the second outer edge OE2 and the third center line CL3, when viewed in the up-down direction. Thus, the distance between the first row L1 and the second row L2 is further increased. Thus, the cross-sectional area of the current path in the first signal conductor 22a and the second signal conductor 22b becomes wider. As a result, with the multilayer substrate 10, the resistance of the multilayer substrate 10 can be further reduced.

With the multilayer substrate 10, the resistance of the multilayer substrate 10 can also be reduced for the following reasons. More specifically, the shortest distance D1 from each of the plurality of first interlayer connection conductors v1 to the first outer edge OE1 is larger than the maximum diameter of the plurality of first interlayer connection conductors v1. Thus, the distance between the plurality of first interlayer connection conductors v1 and the ground conductors 24a to 24c is increased. As a result, the parasitic capacitance generated between the plurality of first interlayer connection conductors v1 and the ground conductors 24a to 24c is reduced. Similarly, the distance between the plurality of first interlayer connection conductors v1 and the plurality of interlayer connection conductors v10 and v11 (ground interlayer connection conductors) is increased. As a result, the parasitic capacitance generated between the plurality of first interlayer connection conductors v1 and the plurality of interlayer connection conductors v10 and v11 (ground interlayer connection conductors) is reduced. Consequently, with the multilayer substrate 10, the AC resistance of the multilayer substrate 10 can be reduced.

With the multilayer substrate 10, the resistance of the multilayer substrate 10 can also be reduced for the following reasons. More specifically, each of the plurality of interlayer connection conductors v10 (ground interlayer connection conductors) does not overlap the plurality of first interlayer connection conductors v1 when viewed in the front-back direction. Thus, the distance between the plurality of first interlayer connection conductors v1 and the plurality of interlayer connection conductors v10 (ground interlayer connection conductors) is increased. As a result, the parasitic capacitance generated between the plurality of first interlayer connection conductors v1 and the plurality of interlayer connection conductors v10 (ground interlayer connection conductors) is reduced. Consequently, with the multilayer substrate 10, the AC resistance of the multilayer substrate 10 can be reduced.

With the multilayer substrate 10, the resistance of the multilayer substrate 10 can also be reduced for the following reasons. When viewed in the up-down direction, the shortest distance d1 between the ground conductor 24a and the first signal conductor 22a is larger than the maximum diameter of the plurality of first interlayer connection conductors v1. Thus, the distance between the first signal conductor 22a and the ground conductor 24a is increased. As a result, the parasitic capacitance generated between the first signal conductor 22a and the ground conductor 24a is reduced. Consequently, with the multilayer substrate 10, the AC resistance of the multilayer substrate 10 can be reduced.

With the multilayer substrate 10, the resistance of the multilayer substrate 10 can also be reduced for the following reasons. More specifically, when the line width of the first signal conductor 22a and the line width of the second signal conductor 22b are large, the effect of resistance reduction by the plurality of first interlayer connection conductors v1 and the plurality of second interlayer connection conductors v2 becomes small at the center of the first signal conductor 22a in the line width direction and the center of the second signal conductor 22b in the line width direction. Therefore, the plurality of third interlayer connection conductors v3 electrically connect the first signal conductor 22a and the second signal conductor 22b. The plurality of third interlayer connection conductors v3 are located between the first row L1 and the second row L2, when viewed in the up-down direction. Thus, the effect of resistance reduction by the plurality of third interlayer connection conductors v3 is produced at the center of the first signal conductor 22a in the line width direction and at the center of the second signal conductor 22b in the line width direction. As a result, with the multilayer substrate 10, the resistance of the multilayer substrate 10 can be further reduced.

However, due to the skin effect, current is unlikely to flow in the center of the first signal conductor 22a in the line width direction and the center of the second signal conductor 22b in the line width direction. Therefore, the number of the third interlayer connection conductors v3 may be less than the number of the first interlayer connection conductors v1 and the number of the second interlayer connection conductors v2. Thus, flatness of the first signal conductor 22a is prevented from being impaired by the third interlayer connection conductors v3. In addition, the manufacturing cost of the multilayer substrate 10 is reduced.

With the multilayer substrate 10, the resistance of the multilayer substrate 10 can also be reduced for the following reasons. More specifically, in the multilayer substrate 10, each of the plurality of fourth interlayer connection conductors v4 does not overlap a respective one of the plurality of first interlayer connection conductors v1 when viewed in the up-down direction. Thus, current paths that connect the first interlayer connection conductors v1 and the fourth interlayer connection conductors v4 are generated in the second signal conductor 22b. Thus, the cross-sectional area of the current path becomes wider in the second signal conductor 22b. As a result, with the multilayer substrate 10, the resistance of the multilayer substrate 10 can be further reduced.

First Variation

Figure 4:
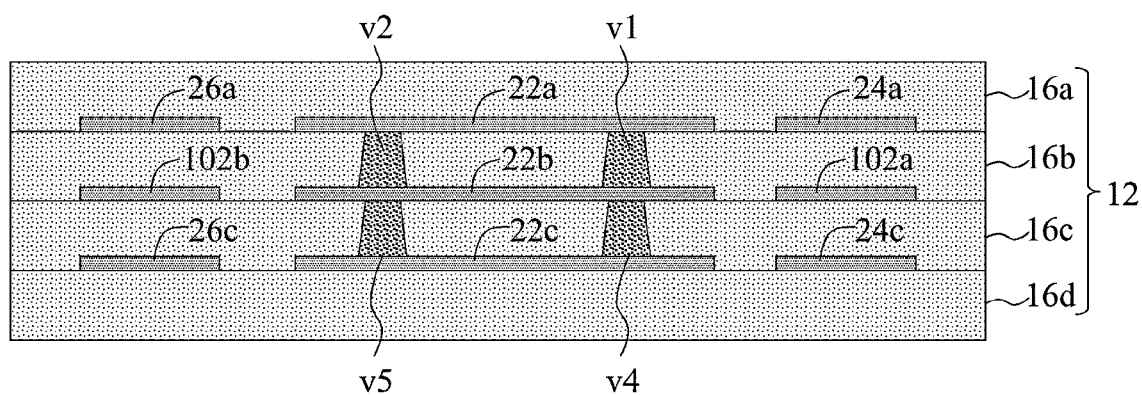
Figure 4:
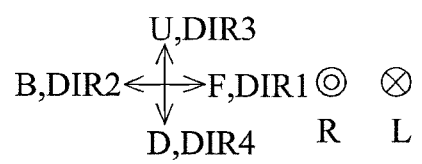

A multilayer substrate 10a according to a first variation of a preferred embodiment of the present invention will be described below with reference to the drawings. FIG. 4 is a cross-sectional view of the multilayer substrate 10a. FIG. 4 shows a cross section perpendicular to the left-right direction.

The multilayer substrate 10a differs from the multilayer substrate 10 in that it is further provided with a first different-potential signal conductor 102a and a second different-potential signal conductor 102b, instead of the ground conductors 24b and 26b. The first different-potential signal conductor 102a is provided in a laminate 12. The first different-potential signal conductor 102a is located below a ground conductor 24a (first ground conductor/first different-potential conductor) (i.e., located farther in the fourth direction DIR4 than the ground conductor 24a (first ground conductor/first different-potential conductor)). The first different-potential signal conductor 102a is located above a ground conductor 24c. In the present preferred embodiment, the first different-potential signal conductor 102a is located on an upper main surface of a resin layer 16c. Furthermore, the first different-potential signal conductor 102a overlaps the ground conductor 24a (first ground conductor/first different-potential conductor) when viewed in the up-down direction (lamination direction). The first different-potential signal conductor 102a overlaps the ground conductor 24c when viewed in the up-down direction (lamination direction). Thus, the first different-potential signal conductor 102a and the ground conductors 24a and 24c have a stripline structure. Since the structure of the second different-potential signal conductor 102b is front-back symmetrical with the structure of the first different-potential signal conductor 102a, its description is omitted. The frequency of a high-frequency signal transmitted through the first different-potential signal conductor 102a (second different-potential conductor) and the second different-potential signal conductor 102b is higher than the frequency of a high-frequency signal transmitted through a first signal conductor 22a and a second signal conductor 22b. The frequency of the high-frequency signal transmitted through the first different-potential signal conductor 102a and the second different-potential signal conductor 102b belongs to a 2.4 GHz band and/or a 5 GHz band.

The position of the first signal conductor 22a in the up-down direction (lamination direction) is located above the position of the ground conductor 24a (first ground conductor) in the up-down direction (lamination direction) (i.e., located farther in the third direction DIR3 than the position of the ground conductor 24a (first ground conductor)), or is the same as the position of the ground conductor 24a (first ground conductor) in the up-down direction (lamination direction). In the present preferred embodiment, the position of the first signal conductor 22a in the up-down direction (lamination direction) is the same as the position of the ground conductor 24a (first ground conductor) in the up-down direction (lamination direction). Therefore, the first signal conductor 22a and the ground conductor 24a are located on an upper main surface of a resin layer 16b.

The position of the second signal conductor 22b in the up-down direction (lamination direction) is located below the position of the ground conductor 24a (first ground conductor/first different-potential conductor) in the up-down direction (lamination direction) (i.e., located farther in the fourth direction DIR4 than the position of the ground conductor 24a (first ground conductor/first different-potential conductor)). In the present preferred embodiment, the position of the second signal conductor 22b in the up-down direction (lamination direction) is the same as the position of the first different-potential signal conductor 102a in the up-down direction (lamination direction). Therefore, the second signal conductor 22b and the first different-potential signal conductor 102a are located on the upper main surface of the resin layer 16c. Since the other structures of the multilayer substrate 10a are the same as those of the multilayer substrate 10, their description is omitted.

With the multilayer substrate 10a, the size of the multilayer substrate 10a in the up-down direction is reduced. More specifically, the frequency of the high-frequency signal transmitted through the first different-potential signal conductor 102a and the second different-potential signal conductor 102b is higher than the frequency of the high-frequency signal transmitted through the first signal conductor 22a and the second signal conductor 22b. In other words, the frequency of the high-frequency signal transmitted through the first signal conductor 22a and the second signal conductor 22b is lower than the frequency of the high-frequency signal transmitted through the first different-potential signal conductor 102a and the second different-potential signal conductor 102b. The wavelength of the high-frequency signal transmitted through the first signal conductor 22a tends to be longer than the length of the first signal conductor 22a. Therefore, it is difficult to generate stationary waves between the two ends of the first signal conductor 22a. Therefore, it is not necessary to provide a ground conductor above the first signal conductor 22a since noise is less likely to be radiated from the first signal conductor 22a.

Therefore, the position of the first signal conductor 22a in the up-down direction (lamination direction) is located above the position of the ground conductor 24a (first ground conductor) in the up-down direction (lamination direction) (i.e., located farther in the third direction DIR3 than the position of the ground conductor 24a (first ground conductor)), or is the same as the position of the ground conductor 24a (first ground conductor) in the up-down direction (lamination direction n). Thus, in the multilayer substrate 10a, the first signal conductor 22a can be located near the upper main surface of the laminate 12. As a result, the size of the multilayer substrate 10a in the up-down direction is reduced since no further conductors need to be provided above the first signal conductor 22a.

In general, a multilayer substrate often has a ground conductor provided in an area above the signal conductor. On the other hand, in the multilayer substrate 10a, the first signal conductor 22a can be located near the upper main surface of the laminate 12. In other words, in the multilayer substrate 10a, the first signal conductor 22a is located in the area where a ground conductor is generally provided. Thus, it is not necessary to increase a resin layer to dispose the first signal conductor 22a. In other words, even if the number of signal conductors increases, the size of the laminate 12 in the up-down direction is unlikely to increase. Thus, the resistance of the multilayer substrate 10a is reduced while reducing or preventing the increase of the size of the laminate 12 in the up-down direction. In other words, the size of each signal conductor layer in the up-down direction may be reduced for obtaining a desired resistance value of the multilayer substrate 10a. As a result, the size of the multilayer substrate 10a in the up-down direction can be reduced while reducing or preventing the increase in resistance of the multilayer substrate 10a.

In the multilayer substrate 10a, the first signal conductor 22a exists at the same position as the position of the ground conductor 24a in the up-down direction. Therefore, the same position as the position of the ground conductor 24a in the up-down direction is also used as a space for disposing the signal conductor. In other words, in the multilayer substrate 10a, the number of the signal conductors can be increased. The parallel connection of the plurality of signal conductors can reduce the resistance of the multilayer substrate 10a.

Second Variation

Figure 5:
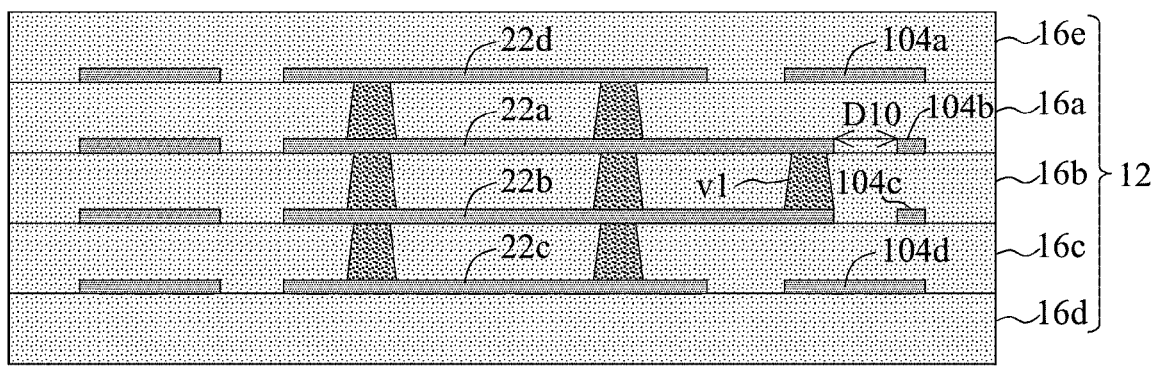
FIG. 5 is a cross-sectional view of a multilayer substrate 10b.
Figure 5:
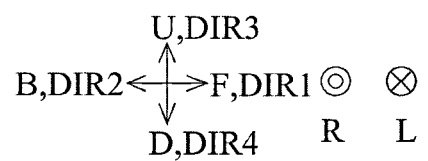

A multilayer substrate 10b according to a second variation of a preferred embodiment of the present invention will be described below with reference to the drawings. FIG. 5 is a cross-sectional view of the multilayer substrate 10b. FIG. 5 shows a cross section perpendicular to the left-right direction.

The multilayer substrate 10b differs from the multilayer substrate 10 in that it is further provided with a resin layer 16e, a first different-potential conductor 104a, a second different-potential conductor 104b, a third different-potential conductor 104c, a fourth different-potential conductor 104d and a fourth signal conductor 22d. The resin layer 16e is laminated on top of the resin layer 16a.

The fourth signal conductor 22d, a first signal conductor 22a, a second signal conductor 22b, and a third signal conductor 22c are located on an upper main surface of a resin layer 16e, an upper main surface of a resin layer 16a, an upper main surface of a resin layer 16b, an upper main surface of a resin layer 16c, and an upper main surface of a resin layer 16d, respectively. The line width of the first signal conductor 22a and the line width of the second signal conductor 22b are different from the line width of the third signal conductor 22c and the line width of the fourth signal conductor 22d. The line width of the first signal conductor 22a and line width of the second signal conductor 22b are larger than the line width of the third signal conductor 22c and line width of the fourth signal conductor 22d, respectively.

The first different-potential conductor 104a, the second different-potential conductor 104b, the third different-potential conductor 104c, and the fourth different-potential conductor 104d are provided in a laminate 12. The potential of the first different-potential conductor 104a, the potential of the second different-potential conductor 104b, the potential of the third different-potential conductor 104c, and the potential of the fourth different-potential conductor 104d are different from the potential of the first signal conductor 22a, the potential of the second signal conductor 22b, the potential of the third signal conductor 22c, and the potential of the fourth signal conductor 22d, respectively. The first different-potential conductor 104a, the second different-potential conductor 104b, the third different-potential conductor 104c, and the fourth different-potential conductor 104d are arranged in this order from up to down. Specifically, the first different-potential conductor 104a, the second different-potential conductor 104b, the third different-potential conductor 104c, and the fourth different-potential conductor 104d are located on the upper main surface of the resin layer 16a, the upper main surface of the resin layer 16b, the upper main surface of the resin layer 16c, and the upper main surface of the resin layer 16d, respectively. Thus, the first different-potential conductor 104a is located above the first signal conductor 22a (i.e., located farther in the third direction DIR3 than the first signal conductor 22a).

Each of the first different-potential conductor 104a and the second different-potential conductor 104b is located in front of the first signal conductor 22a (i.e., located farther in the first direction DIR1 than the first signal conductor 22a). However, when viewed in the up-down direction (lamination direction), the shortest distance D10 between the second different-potential conductor 104b and the first signal conductor 22a is larger than the maximum diameter of the plurality of first interlayer connection conductors v1. When viewed in the up-down direction (lamination direction), the first different-potential conductor 104a overlaps a portion of the first signal conductor 22a. Furthermore, when viewed in the up-down direction (lamination direction), the first different-potential conductor 104a overlaps at least one of the plurality of first interlayer connection conductors v1. Since the other structures of the multilayer substrate 10b are the same as those of the multilayer substrate 10, their description is omitted. The multilayer substrate 10b can achieve the same effect as the multilayer substrate 10.

In the multilayer substrate 10b, the first different-potential conductor 104a overlaps the first signal conductor 22a when viewed in the up-down direction (lamination direction). Furthermore, when viewed in the up-down direction (lamination direction), the first different-potential conductor 104a overlaps at least one of the plurality of first interlayer connection conductors v1. Owing to such structure of the multilayer substrate 10b, the design freedom of the multilayer substrate 10b is increased.

Third Variation

Figure 6:
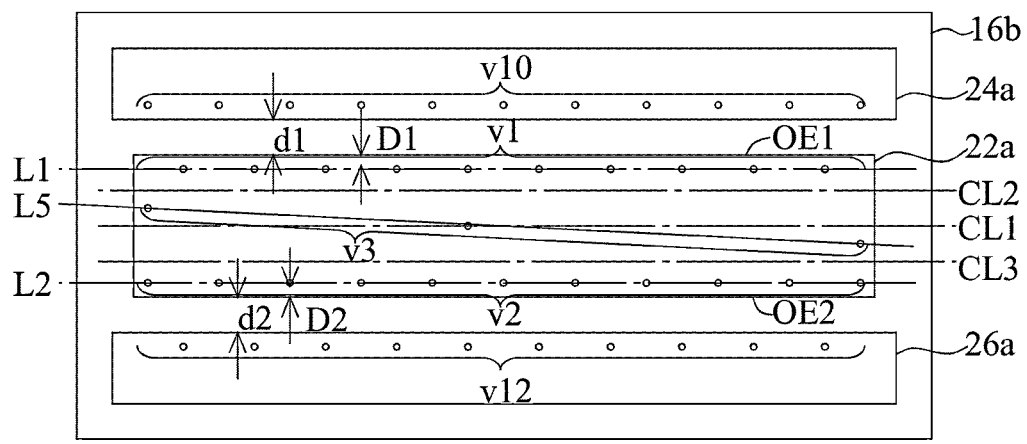
FIG. 6 is a top view of a resin layer 16b of a multilayer substrate 10c.
Figure 6:
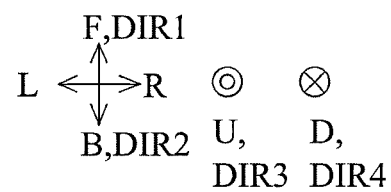

A multilayer substrate 10c according to a third variation of a preferred embodiment of the present invention will be described below with reference to the drawings. FIG. 6 is a top view of a resin layer 16b of the multilayer substrate 10c.

The multilayer substrate 10c differs from the multilayer substrate 10 in the following points.

Each of a plurality of second interlayer connection conductors v2 does not overlap a respective one of a plurality of first interlayer connection conductors v1 when viewed in the front-back direction (line width direction).

Thus, when viewed in the front-back direction (line width direction), the plurality of first interlayer connection conductors v1 and the plurality of second interlayer connection conductors v2 are alternately aligned in the left-right direction. Since the other structures of the multilayer substrate 10c are the same as those of the multilayer substrate 10, their description is omitted. The multilayer substrate 10c can achieve the same effect as the multilayer substrate 10.

With the multilayer substrate 10c, the resistance of the multilayer substrate 10c an be reduced. More specifically, current paths connecting the first interlayer connection conductors v1 and the second interlayer connection conductors v2 in a first signal conductor 22a and a second signal conductor 22b are inclined at an angle to the left-right direction. Thus, the cross-sectional area of the current path in the first signal conductor 22a and the second signal conductor 22b becomes wider. As a result, with the multilayer substrate 10c, the resistance of multilayer substrate 10c can be reduced.

With the multilayer substrate 10c, the resistance of the multilayer substrate 10c can be reduced. More specifically, each of the plurality of second interlayer connection conductors v2 does not overlap a respective one of the plurality of first interlayer connection conductors v1 when viewed in the front-back direction (line width direction). Thus, the distance between the plurality of first interlayer connection conductors v1 and the plurality of second interlayer connection conductors v2 is increased. As a result, the parasitic capacitance generated between the plurality of first interlayer connection conductors v1 and the plurality of second interlayer connection conductors v2 is reduced. Consequently, with the multilayer substrate 10c, the AC resistance of the multilayer substrate 10c can be reduced.

With the multilayer substrate 10c, the resistance of the multilayer substrate 10c can be reduced. More specifically, each of the plurality of interlayer connection conductors v10 (ground interlayer connection conductors) does not overlap a respective one of the plurality of first interlayer connection conductors v1 when viewed in the front-back direction. Thus, the distance between the plurality of first interlayer connection conductors v1 and the plurality of interlayer connection conductors v10 (ground interlayer connection conductors) is increased. As a result, the parasitic capacitance generated between the plurality of first interlayer connection conductors v1 and the plurality of interlayer connection conductors v10 (ground interlayer connection conductors) is reduced. Consequently, according to the multilayer substrate 10c, the AC resistance of the multilayer substrate 10c can be reduced.

Fourth Variation

Figure 7:
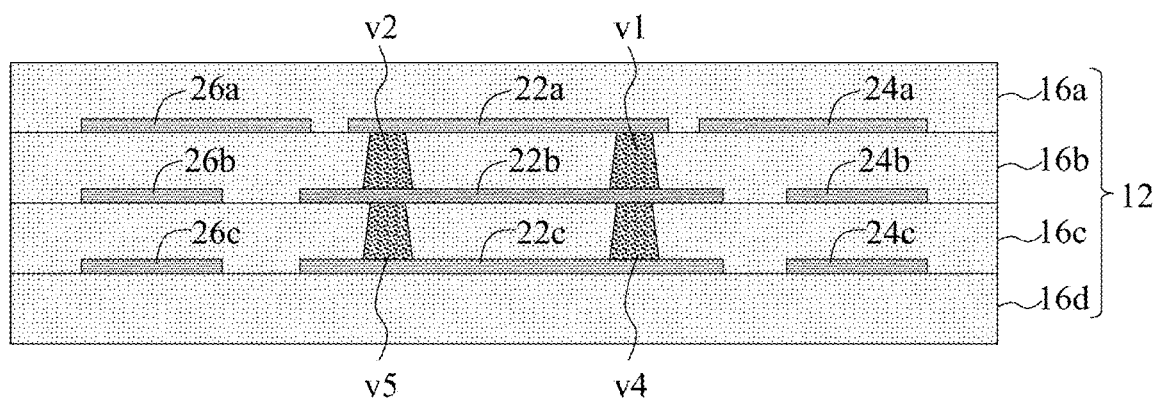
FIG. 7 is a cross-sectional view of a multilayer substrate 10d.
Figure 7:

A multilayer substrate 10d according to a fourth variation of a preferred embodiment of the present invention will be described below with reference to the drawings. FIG. 7 is a cross-sectional view of the multilayer substrate 10d.

The multilayer substrate 10d differs from the multilayer substrate 10 in that the line width of a first signal conductor 22a differs from the line width of a second signal conductor 22b and the line width of a third signal conductor 22c. In the present preferred embodiment, the line width of the first signal conductor 22a is smaller than the line width of the second signal conductor 22b and the line width of the third signal conductor 22c. Since the other structures of the multilayer substrate 10d is the same as those of the multilayer substrate 10, their description is omitted. The multilayer substrate 10d has the same effect as the multilayer substrate 10.

Other Preferred Embodiments

The circuit boards according to preferred embodiments of the present invention are not limited to the multilayer substrates 10 and 10a to 10d, but can be modified within the scope of the gist of the present invention. Note that the configurations of the multilayer substrates 10 and 10a to 10d may be combined as desired.

Note that the third signal conductor 22c and the fourth signal conductor 22d are not essential components.

Note that the first different-potential conductor 104a, the second different-potential conductor 104b, the third different-potential conductor 104c, and the fourth different-potential conductor 104d may each be a ground conductor or a signal conductor.

Note that the third interlayer connection conductors v3 are not essential components.

The number of the third interlayer connection conductors v3 may be one or more. The number of the plurality of third interlayer connection conductors v3 may also be greater than or equal to the number of the plurality of first interlayer connection conductors v1 and the number of the plurality of second interlayer connection conductors v2.

Note that the ground conductors 24a to 24c and 26a to 26c are not essential components.

Note that each of the plurality of interlayer connection conductors v10 may overlap a respective one of the plurality of first interlayer connection conductors v1 when viewed in the front-back direction.

Note that each of the plurality of fourth interlayer connection conductors v4 may but does not have to overlap a respective one of the plurality of first interlayer connection conductors v1, when viewed in the up-down direction.

Note that each of the plurality of fifth interlayer connection conductors v5 may but does not have to overlap a respective one of the plurality of second interlayer connection conductors v2, when viewed in the up-down direction.

Note that the first row L1 may but does not have to overlap the third row L3 when viewed in the up-down direction.

Note that the second row L2 may but does not have to overlap the fourth row L4 when viewed in the up-down direction.

Note that the plurality of first interlayer connection conductors v1 and the plurality of second interlayer connection conductors v2 need not be aligned at equal intervals.

Note that the first row L1 and the second row L2 may be located in front of the first center line CL1. The first row L1 and the second row L2 may also be located behind the first center line CL1.

Note that at least a portion of each of the plurality of first interlayer connection conductors v1 may be located between the first center line CL1 and the second center line CL2 when viewed in the up-down direction.

Note that at least a portion of each of the plurality of second interlayer connection conductors v2 may be located between the first center line CL1 and the third center line CL3 when viewed in the up-down direction.

Note that the shortest distance d1 from each of the plurality of first interlayer connection conductors v1 to the first outer edge OE1 may be equal to or less than the maximum diameter of the plurality of first interlayer connection conductors v1.

Note that, in the multilayer substrate 10b, the first different-potential conductor 104a does not have to overlap the first interlayer connection conductors v1 when viewed in the up-down direction.

Note that, in the multilayer substrate 10b, the shortest distance D10 between the second different-potential conductor 104b and the first signal conductor 22a may be equal to or less than the maximum diameter of the plurality of first interlayer connection conductors v1, when viewed in the up-down direction.

Note that the laminate 12 may be bent in the front-back direction when viewed in the up-down direction.

Note that the first row L1 and the second row L2 do not have to be straight lines. The first row L1 and the second row L2 may be curved lines.

In the multilayer substrates 10 and 10a to 10c, the entire second signal conductor 22b overlaps the first signal conductor 22a when viewed in the up-down direction. However, only a portion of the second signal conductor 22b may overlap the first signal conductor 22a when viewed in the up-down direction.

Note that the frequency of the high-frequency signal transmitted through the first different-potential signal conductor 102a and the second different-potential signal conductor 102b may be equal to or less than the frequency of the high-frequency signal transmitted through the first signal conductor 22a and the second signal conductor 22b.

Note that the down direction may be the third direction DIR3, and the up direction may be the fourth direction DIR4.

Note that the back direction may be the first direction DIR1, and the front direction may be the second direction DIR2.

Note that the material of the resin layers 16a to 16d may be a resin other than thermoplastic resin. However, if the material of the resin layers 16a to 16d is a thermoplastic resin, the multilayer substrate 10 can be plastically deformed.

Note that the multilayer substrate 10 may be further provided with a ground conductor that is located above the first signal conductor 22a and that overlaps the first signal conductor 22a when viewed in the up-down direction. The multilayer substrate 10 may further be provided with a ground conductor that is located below the third signal conductor 22c and that overlaps the third signal conductor 22c when viewed in the up-down direction.

Note that, in the multilayer substrate 10a, the position of the first signal conductor 22a in the up-down direction (lamination direction) may be located above the position of the ground conductor 24a (first ground conductor) in the up-down direction (lamination direction) (i.e., located farther in the third direction DIR3 than the position of the ground conductor 24a (first ground conductor)).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprises: a laminate including a plurality of resin layers laminated in a lamination direction; a first signal conductor provided in the laminate; a second signal conductor provided in the laminate, a position of the second signal conductor in the lamination direction being different from a position of the first signal conductor in the lamination direction, at least a portion of the second signal conductor overlapping the first signal conductor when viewed in the lamination direction; a plurality of first interlayer connection conductors passing through the resin layers in the lamination direction and electrically connecting the first signal conductor and the second signal conductor; and a plurality of second interlayer connection conductors passing through the resin layers in the lamination direction and electrically connecting the first signal conductor and the second signal conductor; wherein the plurality of first interlayer connection conductors are aligned in a first row extending along the first signal conductor when viewed in the lamination direction; the plurality of second interlayer connection conductors are aligned in a second row extending along the first signal conductor when viewed in the lamination direction; a direction perpendicular to the direction in which the first signal conductor extends, when viewed in the lamination direction, is a line width direction; a position of the second row in the line width direction is different from a position of the first row in the line width direction; each of the plurality of second interlayer connection conductors does not overlap a respective one of the plurality of first interlayer connection conductors when viewed in the line width direction, wherein one side of the lamination direction is a third direction and the other side of the lamination direction is a fourth direction; the second signal conductor is located farther in the fourth direction than the first signal conductor; the multilayer substrate further comprises: a third signal conductor that is provided in the laminate, that is located farther in the fourth direction than the second signal conductor, and that overlaps the first signal conductor and the second signal conductor when viewed in the lamination direction; and a plurality of fourth interlayer connection conductors passing through the resin layers in the lamination direction and electrically connecting the second signal conductor and the third signal conductor; and the plurality of fourth interlayer connection conductors are aligned in a third row along the second signal conductor when viewed in the lamination direction.

2. The multilayer substrate of claim 1, further comprising:
one or more third interlayer connection conductors passing through the resin layers in the lamination direction and electrically connecting the first signal conductor and the second signal conductor; wherein
the one or more third interlayer connection conductors are located between the first row and the second row, when viewed in an up-down direction.

3. The multilayer substrate according to claim 2, wherein a number of the one or more third interlayer connection conductors is less than a number of the plurality of first interlayer connection conductors and the plurality of second interlayer connection conductors.

4. The multilayer substrate according to claim 1, wherein one side of the line width direction is a first direction and the other side of the line width direction is a second direction; and
the multilayer substrate further comprises a first different-potential conductor provided in the laminate and located farther in the first direction than the first signal conductor.

5. The multilayer substrate according to claim 4, wherein the first different-potential conductor is a first ground conductor; and
the multilayer substrate further comprises:
a second ground conductor provided in the laminate, a position of the second ground conductor in the lamination direction being different from a position of the first ground conductor in the lamination direction, the second ground conductor overlapping the first ground conductor when viewed in the lamination direction; and
one or more ground interlayer connection conductors passing through the resin layers in the lamination direction and electrically connecting the first ground conductor and the second ground conductor.

6. The multilayer substrate according to claim 5, wherein a number of the one or more ground interlayer connection conductors is plural; and
the plurality of the ground interlayer connection conductors are aligned along the first signal conductor.

7. The multilayer substrate according to claim 6, wherein the second row is located farther in the second direction than the first row; and
each of the plurality of ground interlayer connection conductors does not overlap a respective one of the plurality of first interlayer connection conductors when viewed in the line width direction.

8. The multilayer substrate according to claim 1, wherein a number of the plurality of first interlayer connection conductors is three or more; and
at least some of the plurality of first interlayer connection conductors are aligned at equal intervals.

9. The multilayer substrate according to claim 1, wherein one side of the line width direction is a first direction and the other side of the line width direction is a second direction;
a line passing through the center of the first signal conductor in the line width direction when viewed in the lamination direction is a first center line;
the first row is located farther in the first direction than the first center line; and
the second row is located farther in the second direction than the first center line.

10. The multilayer substrate according to claim 9, wherein when viewed in an up-down direction, an outer edge of the first signal conductor includes a first outer edge;
when viewed in the lamination direction, the first outer edge is located farther in the first direction than the first center line and extends in a direction perpendicular to the line width direction;
a line passing through a midpoint between the first center line and the first outer edge when viewed in the lamination direction is a second center line; and
at least a portion of each of the plurality of first interlayer connection conductors is located between the first outer edge and the second center line, when viewed in the up-down direction.

11. The multilayer substrate according to claim 1, wherein one side of the line width direction is a first direction and the other side of the line width direction is a second direction;
the second row is located farther in the second direction than the first row;
a line passing through the center of the first signal conductor in the line width direction when viewed in the lamination direction is a first center line;
an outer edge of the first signal conductor includes a first outer edge when viewed in an up-down direction;
when viewed in the lamination direction, the first outer edge is located farther in the first direction than the first center line and extends in a direction perpendicular to the line width direction; and
a shortest distance from each of the plurality of first interlayer connection conductors to the first outer edge is larger than a maximum diameter of the plurality of first interlayer connection conductors.

12. The multilayer substrate according to claim 4, wherein one side of the lamination direction is a third direction and the other side of the lamination direction is a fourth direction;
the second signal conductor is located farther in the fourth direction than the first signal conductor;

the multilayer substrate further comprises a second different-potential conductor that is provided in the laminate, that is located farther in the fourth direction than the first different-potential conductor, and that overlaps the first different-potential conductor when viewed in the lamination direction;
the first different-potential conductor is a first ground conductor; and
the second different-potential conductor is a fourth signal conductor.

13. The multilayer substrate according to claim 12, wherein a position of the first signal conductor in the lamination direction is located farther in the third direction than a position of the first different-potential conductor in the lamination direction, or is at a same position as the first different-potential conductor in the lamination direction.

14. The multilayer substrate according to claim 12, wherein a position of the second signal conductor in the lamination direction is located farther in the fourth direction than a position of the first different-potential conductor in the lamination direction.

15. The multilayer substrate according to claim 12, wherein a frequency of a high-frequency signal transmitted through the second different-potential conductor is higher than a frequency of a high-frequency signal transmitted through the first signal conductor and the second signal conductor.

16. The multilayer substrate according to claim 12, wherein
a potential of the first different-potential conductor is different from a potential of the first signal conductor and a potential of the second signal conductor;
the second signal conductor is located farther in the fourth direction than the first signal conductor;
the first different-potential conductor is located farther in the third direction than the first signal conductor; and
when viewed in the lamination direction, the first different-potential conductor overlaps a portion of the first signal conductor.

17. The multilayer substrate according to claim 16, wherein at least one or more of the plurality of first interlayer connection conductors overlaps the first different-potential conductor when viewed in the lamination direction.

18. The multilayer substrate according to claim 16, further comprising:
a second different-potential conductor that is provided in the laminate and that is located farther in the first direction than the first signal conductor; wherein
the second different-potential conductor is located farther in the fourth direction than the first different-potential conductor; and
when viewed in the lamination direction, a shortest distance between the second different-potential conductor and the first signal conductor is larger than a maximum diameter of the plurality of first interlayer connection conductors.

19. The multilayer substrate according to claim 1, wherein a line width of the first signal conductor is different from a line width of the second signal conductor.

20. A multilayer substrate comprises:
a laminate including a plurality of resin layers laminated in a lamination direction;
a first signal conductor provided in the laminate;
a second signal conductor provided in the laminate, a position of the second signal conductor in the lamination direction being different from a position of the first signal conductor in the lamination direction, at least a portion of the second signal conductor overlapping the first signal conductor when viewed in the lamination direction;
a plurality of first interlayer connection conductors passing through the resin layers in the lamination direction and electrically connecting the first signal conductor and the second signal conductor;
a plurality of second interlayer connection conductors passing through the resin layers in the lamination direction and electrically connecting the first signal conductor and the second signal conductor; and
one or more third interlayer connection conductors passing through the resin layers in the lamination direction and electrically connecting the first signal conductor and the second signal conductor; wherein
the plurality of first interlayer connection conductors are aligned in a first row extending along the first signal conductor when viewed in the lamination direction;
the plurality of second interlayer connection conductors are aligned in a second row extending along the first signal conductor when viewed in the lamination direction;
a direction perpendicular to the direction in which the first signal conductor extends, when viewed in the lamination direction, is a line width direction;
a position of the second row in the line width direction is different from a position of the first row in the line width direction;
the one or more third interlayer connection conductors are located between the first row and the second row, when viewed in an up-down direction; and
a number of the one or more third interlayer connection conductors is less than a number of the plurality of first interlayer connection conductors and the plurality of second interlayer connection conductors.

21. A multilayer substrate comprises:
a laminate including a plurality of resin layers laminated in a lamination direction;
a first signal conductor provided in the laminate;
a second signal conductor provided in the laminate, a position of the second signal conductor in the lamination direction being different from a position of the first signal conductor in the lamination direction, at least a portion of the second signal conductor overlapping the first signal conductor when viewed in the lamination direction;
a plurality of first interlayer connection conductors passing through the resin layers in the lamination direction and electrically connecting the first signal conductor and the second signal conductor; and
a plurality of second interlayer connection conductors passing through the resin layers in the lamination direction and electrically connecting the first signal conductor and the second signal conductor; wherein
the plurality of first interlayer connection conductors are aligned in a first row extending along the first signal conductor when viewed in the lamination direction;
the plurality of second interlayer connection conductors are aligned in a second row extending along the first signal conductor when viewed in the lamination direction;
a direction perpendicular to the direction in which the first signal conductor extends, when viewed in the lamination direction, is a line width direction;
a position of the second row in the line width direction is different from a position of the first row in the line width direction;

one side of the line width direction is a first direction and the other side of the line width direction is a second direction;

the multilayer substrate further comprises a first different-potential conductor provided in the laminate and located farther in the first direction than the first signal conductor and a plurality of ground interlayer connection conductors aligned along the first signal conductor; wherein the second row is located farther in the second direction than the first row; and each of the plurality of ground interlayer connection conductors does not overlap a respective one of the plurality of first interlayer connection conductors when viewed in the line width direction.

* * * * *